United States Patent
Takeuchi et al.

(10) Patent No.: US 9,680,081 B2
(45) Date of Patent: Jun. 13, 2017

(54) PRECURSOR WIRE FOR $NB_3AL$ SUPERCONDUCTING WIRE, $NB_3AL$ SUPERCONDUCTING WIRE, METHOD FOR PRODUCING PRECURSOR WIRE FOR $NB_3AL$ SUPERCONDUCTING WIRE, AND METHOD FOR PRODUCING $NB_3AL$ SUPERCONDUCTING WIRE

(71) Applicants: HITACHI CABLE, LTD., Tokyo (JP); INTER-UNIVERSITY RESEARCH INSTITUTE CORPORATION, Ibaraki (JP); NATIONAL INSTITUTE FOR MATERIALS SCIENCE, Ibaraki (JP)

(72) Inventors: Takao Takeuchi, Ibaraki (JP); Kiyosumi Tsuchiya, Ibaraki (JP); Kazuhiko Nakagawa, Tokyo (JP)

(73) Assignees: NATIONAL INSTITUTE FOR MATERIAL SCIENCE, Ibaraki (JP); INTER-UNIVERSITY RESEARCH INSTITUTE CORPORATION HIGH ENERGY ACCELERATOR RESEARCH ORGANIZATION, Ibaraki (JP)

( * ) Notice: Subject to any disclaimer, the term of this patent is extended or adjusted under 35 U.S.C. 154(b) by 1284 days.

(21) Appl. No.: 13/677,622

(22) Filed: Nov. 15, 2012

(65) Prior Publication Data
US 2015/0348679 A1    Dec. 3, 2015

Related U.S. Application Data

(60) Provisional application No. 61/562,580, filed on Nov. 22, 2011.

(51) Int. Cl.
*H01L 39/24*    (2006.01)
*H01L 39/12*    (2006.01)
(Continued)

(52) U.S. Cl.
CPC .............. *H01L 39/12* (2013.01); *H01L 39/14* (2013.01); *H01L 39/2403* (2013.01);
(Continued)

(58) Field of Classification Search
CPC ................................ H01B 12/02; H01B 13/00
(Continued)

(56) References Cited

U.S. PATENT DOCUMENTS 4,050,147 A  *  9/1977   Winter et al. .................. 29/599
4,917,965 A  *  4/1990   Inoue ...................... H01L 39/14
                                                            257/E39.017
(Continued)

OTHER PUBLICATIONS

T. Takeuchi et al., "Modified Barrier-Type Cu Internally Stabilized RHQT $Nb_3Al$ Wires", home page address; http//www.csj.or.jp/conference/2010a/proceedings2010a.htm, published on Nov. 25, 2010.

(Continued)

*Primary Examiner* — Paul Wartalowicz
(74) *Attorney, Agent, or Firm* — Wenderoth, Lind & Ponack, L.L.P.

(57) ABSTRACT

Problem

There is proposed an innovative cross-sectional structure, with an idea contrary to the conventional one, utilizing the non-reactivity between Cu and Ta (or between Ag and Nb, Ta) in a high-temperature short-time heat treatment, thus achieving (1) the suppression of the low magnetic-field instability, (2) excellent wire drawability of a precursor wire, and (3) the reduction of the cost required for the incorporation of a stabilizer.

Means for Resolution

There is proposed a structure having an assembly of a plurality of single wires, wherein the assembly is covered with an outer cover (skin) formed from Nb or Ta, wherein each of the single wires has an Nb/Al composite filament region which is formed from a composite of Nb and Al mixed in an Nb:Al molar ratio of 3:1, and which is covered with a partition formed from Nb or Ta, and further covered with an interfilamentary barrier formed from Cu or Ag disposed around the partition.

7 Claims, 10 Drawing Sheets

(51) Int. Cl.
 *H01L 39/14* (2006.01)
 *H01B 13/00* (2006.01)
 *H01B 12/02* (2006.01)

(52) U.S. Cl.
 CPC .......... *H01L 39/2409* (2013.01); *H01B 12/02* (2013.01); *H01B 13/00* (2013.01); *Y10T 428/12819* (2015.01)

(58) Field of Classification Search
 USPC ................................................ 505/806, 510
 See application file for complete search history.

(56) References Cited

U.S. PATENT DOCUMENTS

| | | | |
|---|---|---|---|
| 2006/0081307 A1* | 4/2006 | Field et al. ...................... | 148/98 |
| 2008/0188372 A1* | 8/2008 | Motowidlo ......... | H01L 39/2403 505/231 |
| 2009/0036312 A1* | 2/2009 | Thoener et al. .............. | 505/231 |
| 2009/0038822 A1* | 2/2009 | Thoener et al. ........... | 174/125.1 |

OTHER PUBLICATIONS

T. Takeuchi et al., "Modified Barrier-Type CU Internally Stabilized RHQT $Nb_3Al$ Wires", Abstracts of CSJ Conference, vol. 83, 2010, 5 pages, published on Dec. 1, 2010.

T. Takeuchi et al., A New RHQT $Nb_3Al$ Superconducting Wire with a Ta/Cu/Ta Three-Layer Filament-Barrier Structure, Supercond. Sci. Tech vol. 25, 065016, 8 pages, 2012.

T. Takeuchi et al., "Modified Barrier-Type Cu Internally Stabilized RHQT $Nb_3Al$ Wires", home page address; http//www.csj.or.jp/conference/2010a/proceedings2010a.htm, published on Nov. 25, 2010 along with the Translator's Declaration and English translation.

T. Takeuchi et al., "Modified Barrier-Type CU Internally Stabilized RHQT $Nb_3Al$ Wires", Abstracts of CSJ Conference, vol. 83, 2010, 5 pages, published on Dec. 1, 2010 along with the Translator's Declaration and English translation.

* cited by examiner

PRECURSOR WIRE FOR NB₃AL SUPERCONDUCTING WIRE, NB₃AL SUPERCONDUCTING WIRE, METHOD FOR PRODUCING PRECURSOR WIRE FOR NB₃AL SUPERCONDUCTING WIRE, AND METHOD FOR PRODUCING NB₃AL SUPERCONDUCTING WIRE

TECHNICAL FIELD

The present invention relates to a precursor wire for an Nb₃Al superconducting wire, a method for producing a precursor wire for an Nb₃Al superconducting wire, an Nb₃Al superconducting wire, and a method for producing an Nb₃Al superconducting wire.

BACKGROUND ART

Since an Nb₃Al wire produced by rapid-heating, quenching and transformation (RHQT) process which has initially been developed for the use in an NMR gives priority to good superconducting joint performance, and Nb₃Al interfilamentary barrier is formed from Nb which maintains superconductivity even in a magnetic field of less than 1 T, there is a disadvantage in that Nb₃Al filaments are electromagnetically coupled together to cause low magnetic-field instability.

For removing the disadvantage, instead of Nb, Ta which similarly belongs to a high melting-point metal (refractory metal) and which exhibits normal conductivity in a magnetic field of less than 1 T, was used as a barrier material, but there were problems in that the suppression of the low magnetic-field instability was impossible at a temperature lowered to 2 K which is the operation temperature of an accelerator magnet, and a wire breakage often occurred during the wire drawing process of a precursor wire, and the like.

FIG. 1 is a cross-sectional view of a precursor wire for an Nb₃Al wire produced by rapid-heating, quenching and transformation process, in which an interfilamentary barrier is formed from Nb, which has conventionally been developed for the use in the NMR. An outer cover (skin) 1 and dummy filaments 8 constituting a center portion of a wire cross-section are individually formed from Nb which belongs to the high melting-point metal.

An Nb/Al composite filament region 3 is prepared by a jelly roll method in which an Nb foil and an Al foil are stacked and wrapped around an Nb core (see patent document 1 (Japanese Patent No. 4005713)) or a rod-in-tube method in which a number of Al cores or Al alloy cores are dispersed in an Nb matrix (see patent document 2 (Japanese Patent No. 1888312)).

In the RHQT process, a precursor wire, which is reel-to-reel moving, is subjected to rapid heating and quenching treatment by allowing a current to flow through the precursor wire so that the precursor wire is heated to about 1,950° C., and passing the resultant precursor wire through a melted Ga electrode bath kept at about 80° C., which serves also as a coolant, to convert the Nb/Al composite filament regions 3 to bcc phase supersaturated solid solution filaments comprising an Al supersaturated Nb. Then, the resultant wire is subjected to additional heat treatment at 800° C. for 10 hours to change (transform) the crystal structure of the filaments from the bcc phase to an A15 phase, obtaining Nb₃Al superconducting filaments (see patent document 3 (Japanese Patent No. 2021986)).

Nb can maintain the superconducting state in a magnetic field of less than 1 T at 4 K, and therefore when the outer cover 1 and an interfilamentary barrier 4 are formed from Nb, the joint resistance of the joint portions between a number of superconducting wires, which are required in the application to an NMR magnet, can be markedly reduced.

On the other hand, in a magnetic field region of less than 1 T, individual Nb₃Al filaments are electromagnetically coupled together through the Nb interfilamentary barriers 4, so that an effective superconducting filament diameter is disadvantageously increased.

Therefore, the multi-filamentary wire cross-sectional structure having dispersed a number of thin superconducting filaments, which has been proposed for suppressing the magnetic instability, does not properly function in the low magnetic field region. Actually, with respect to a RHQT treated Nb₃Al wire, the precursor wire in which the interfilamentary barrier is formed from Nb, in magnetization curves shown in FIG. 2 as measured at two coolant temperatures expected in the application to a superconducting magnet (i.e., at a liquid helium temperature 4 K and a superfluid helium temperature 2K), magnetic instability called a flux jump occurs such that the magnetic flux line (fluxoid) rapidly penetrates into a sample (the magnetization is rapidly reduced).

For suppressing the low magnetic-field instability, electromagnetically decoupling of Nb₃Al filaments is considered. For achieving this, it is necessary to change the material for interfilamentary barrier from Nb, which maintains superconductivity even in a low magnetic field, to another metal which is in a normal conductivity state in a magnetic field. Such a metal having normal conductivity in a magnetic field is required to have at least the following properties:

(1) excellent wire drawability (plastic deformability) such that the wire drawing of the precursor wire is not inhibited;

(2) excellent mechanical properties even at high temperatures such that the metal serves as a mechanical reinforcement to prevent the precursor wire from suffering a creep rupture during the reel-to-reel heat treatment which is conducted by passing a current through the moving wire (self-heating) at 1,900° C. or higher for 5 seconds or less for converting the Nb/Al composite filament regions to bcc phase supersaturated solid solution filaments; and (3) non-reactivity with the Nb/Al composite filament regions during the reel-to-reel heat treatment, that is, properties such that the metal not only does not inhibit the formation of a supersaturated solid solution after quenching but also does not form a solid solution together with the finally obtained Nb₃Al to cause the deterioration of superconductivity.

As an example of the most candidate material which satisfies the above requirements, there can be mentioned Ta. Ta has a superconducting critical temperature (4.4 K) which is slightly higher than a boiling temperature of liquid He (4.2 K) under atmospheric pressure, but has a small temperature margin (difference between a critical temperature and a coolant temperature), and therefore Ta has characteristics such that transition to the normal conducting state occurs immediately after a magnetic field is applied to Ta.

Further, Ta has the following advantageous properties:

(1) cold wire drawability comparable to that of Nb;

(2) a melting point higher than that of Nb and a creep strength rather higher than that of Nb at about 1,950° C.;

(3) non-reactivity with the Nb/Al composite regions during the reel-to-reel heat treatment; and the like.

In the production of the Nb₃Al precursor wire produced by the RHQT-process in which the interfilamentary barrier is formed from Ta, the wire drawability was a little poor, as compared to that of the precursor wire in which the interfilamentary barrier is formed from Nb, and hence the precursor wire suffered breaking of wire caused from the interfilamentary barrier portion as a starting point three times during the wire drawing, so that the unit length (length per continuous wire) of the resultant wire was disadvantageously small, but the wire drawing was able to be done so that the final wire diameter became 1.35 mm.

FIG. 3 illustrates a transverse cross-sectional structure of the obtained precursor wire. The precursor wire was subjected to rapid heating and quenching treatment to convert the Nb/Al composite filament regions 3 to a bcc phase supersaturated solid solution, and then the resultant wire was further subjected to transformation heat treatment at 800° C. for 10 hours to convert the bcc phase supersaturated solid solution to A15 $Nb_3Al$. As can be seen from the magnetization curves shown in FIG. 4, a flux jump (low magnetic-field instability) was able to be suppressed at 4 K as expected.

However, when the coolant temperature was lowered to 2 K, a flux jump, though slightly, occurred again. From this result, it has been found that the use of the $Nb_3Al$ wire produced by rapid-heating, quenching and transformation process in which the interfilamentary barrier is formed from Ta is difficult in the operation at 2 K which is the temperature of a superconducting magnet expected in a high energy particle accelerator or the like.

The reason for this is considered that the temperature margin of the Ta interfilamentary barrier is large at 2 K so that the $Nb_3Al$ filaments are electromagnetically coupled together.

When the interfilamentary barrier is changed to Ta, at least an effect of suppressing the low magnetic-field instability at 4 K can be obtained without using expensive Ta in the outer cover (skin) and center dummy filaments. Specifically, as seen in the example shown in FIG. 5, relatively inexpensive Nb may be used in the outer cover 1 and center dummy filaments 8.

With respect to the lowering of the wire drawability of the precursor caused due to the employment of Ta in the interfilamentary barrier, for suppressing this, a method has been proposed in which the Nb/Al composite filament region is first covered with a first barrier layer formed from Nb and further covered with a second barrier layer formed from Ta (see patent document 4 (Japanese Patent Application No. 2009-241004)).

By this method, the precursor wire can be prevented from suffering breaking of wire during the wire drawing while surely suppressing the low magnetic-field instability at 4 K; however, the state of the precursor wire in which the adjacent $Nb_3Al$ filaments are connected through a superconducting material of Ta remains unchanged, and therefore the occurrence of a flux jump at 2 K is unavoidable.

As mentioned above, the RHQT-process $Nb_3Al$ multifilamentary wire is produced by subjecting the bcc phase supersaturated solid solution, which has been formed by a high-temperature heat treatment at about 1,950° C. and quenching, to additional heat treatment (transformation heat treatment) at 700 to 900° C. to transform the solid solution to an A15 $Nb_3Al$ compound.

A transformation temperature is relatively low, and hence A15 compound crystal grains obtained after the transformation are finely divided particles, which cause critical current density of $Nb_3Al$ to be high.

In the RHQT-process, there is required a high-temperature short-time heat treatment performed at a temperature even higher than the melting point of Cu used as a stabilizer, and therefore, unlike precursor wires for commercial superconducting wires, the precursor wire cannot have a Cu stabilizer incorporated to a surface thereof in advance.

Instead, a step is needed in which the precursor wire is subjected to rapid heating and quenching treatment, and then subjected to Cu ion plating for improving the adhesion while removing an oxide film on a wire surface (Nb or Ta), and subsequently a large amount of Cu is incorporated to the surface of the precursor wire by electroplating. However, the Cu ion plating/electroplating step has a drawback in that the cost for the wire is increased.

On the other hand, as a method for reducing the cost required for the incorporation of a stabilizer, there has been proposed an internal stabilization method characterized in that a stabilizer is isolated from the Nb/Al composite filament regions by a high melting-point metal to prevent the stabilizer fused during the high-temperature short-time heat treatment from reacting with the Nb/Al composite filament regions to form a non-superconducting ternary compound, so that the stabilizer is initially contained in the cross-section of the wire (see patent document 5 (Japanese Patent No. 4386306)).

In the internal stabilization method, the Cu stabilizer (or Ag stabilizer) filaments having a high electric conductivity are individually covered with Ta (or Nb, Ta), and can be disposed in arbitrary positions of the wire cross-section in principle, but, actually, as shown in FIG. 6, the stabilizer filaments are concentrated and disposed in the middle of the wire cross-section.

According to the combination of types of the materials for the outer cover, interfilamentary barrier, internal stabilizer filaments, and covering layer for the internal stabilizer filaments, various internal stabilized $Nb_3Al$ precursor wires shown in FIGS. 6 to 10 are present.

When the high-temperature short-time heat treatment at about 1,950° C. for converting the Nb/Al composite filament regions to the bcc phase supersaturated solid solution is performed, the Cu (or Ag) stabilizer is fused, but Cu (or Ag) fused liquid is enclosed in a Ta (or Nb, Ta) covering tube. The Ta (or Nb, Ta) covering tube serves as a diffusion barrier, making it possible to prevent a reaction of Cu (or Ag) with the Nb/Al filament regions. Like bulkheads of an oil tanker, Ta (or Nb, Ta) layers of a honeycomb form serve as walls for enclosing the Cu (or Ag) fused liquid, further preventing the wire from suffering creep deformation in heating at high temperatures.

After quenched to 500° C. or lower, the Cu (or Ag) fused liquid is solidified and serves as a stabilizer. With respect to the precursor wire obtained in the same manner as in the conventional precursor wire containing no internal stabilizer filaments in the cross-section (FIGS. 1, 3, and 5) where the Nb/Al composite filament regions would be converted to the bcc phase supersaturated solid solution by quenching and then subjected to additional heat treatment at 800° C. for 10 hours to transform the bcc phase supersaturated solid solution to $Nb_3Al$, a critical current density calculated by dividing a critical current by a sectional area of an $Nb_3Al$ phase was the same as that of the precursor wire containing no internal stabilizer filaments.

When the internal stabilizer is Cu, the interfilamentary barrier formed from Ta suppresses the occurrence of a flux jump at 4 K, but the occurrence of a small flux jump at 2 K is unavoidable.

Further, the precursor wire suffered a wire breakage caused from the interfilamentary barrier portion as a starting point during the wire drawing of precursor wire, as illustrated in FIGS. 3 and 5, in which no internal stabilizer is contained but the interfilamentary barrier is formed from Ta.

On the other hand, when the internal stabilizer is Ag, which is not reacted with Nb or Ta at a high temperature (1,950° C.), a rapid heating and quenching treatment can be made, irrespective of whether the interfilamentary barrier is formed from Nb or Ta. However, when the interfilamentary barrier is formed from Nb (critical temperature: 9 K), which exhibits superconductivity even in a magnetic field, the $Nb_3Al$ filaments are electromagnetically coupled together, causing marked low magnetic-field instability at both temperatures of 4 K and 2 K. When the interfilamentary barrier is formed from Ta (critical temperature: 4 K), like the case where the internal stabilizer is Cu, the occurrence of a small flux jump at 2 K is unavoidable, and the precursor wire inevitably suffers a wire breakage during the wire drawing.

Problems that the Invention is to Solve

The present invention has been made for solving the above problems accompanying the conventional techniques, and its object is to provide an innovative cross-sectional structure of a precursor wire, with an idea contrary to the conventional one, utilizing the non-reactivity between Cu and Ta (or between Ag and Nb, Ta) in a high-temperature short-time heat treatment which is the essence of the internal stabilization technique, thus achieving (1) the suppression of the low magnetic-field instability, (2) excellent wire drawability of the precursor wire, and (3) the reduction of the cost required for the incorporation of a stabilizer.

Means for Solving the Problems

For solving the above problems, the present invention has the following characteristic features.

The first invention is a precursor wire for $Nb_3Al$ superconducting wire, comprising an assembly of a plurality of single wires, wherein the assembly is covered with an outer cover formed from Nb or Ta, wherein each of the single wires has an Nb/Al composite filament region which is formed from a composite of Nb and Al mixed in an Nb:Al molar ratio of 3:1, and which is covered with a partition formed from Nb or Ta, and further covered with an interfilamentary barrier formed from Cu or Ag disposed around the partition.

The second invention is the precursor wire for $Nb_3Al$ superconducting wire of the above first invention, wherein internal stabilizer filaments each formed from Cu or Ag and covered with an internal stabilizer filament covering layer formed from Nb or Ta are disposed inside the assembly.

The third invention is the precursor wire for $Nb_3Al$ superconducting wire of the above first invention, wherein dummy filaments each formed from Nb or Ta and covered with a dummy-filament-covering-layer formed from Cu or Ag are disposed inside the assembly.

The fourth invention is the precursor wire for $Nb_3Al$ superconducting wire of the above first to third inventions, wherein the volume ratio of Cu or Ag in the single wire is 7 to 25%.

The fifth invention is the precursor wire for $Nb_3Al$ superconducting wire of the above first to fourth inventions, wherein when. Cu is used as a constitutional element of cross-section of the assembly, a material in contact with the Cu is Ta.

The sixth invention is the precursor wire for $Nb_3Al$ superconducting wire of the above fifth invention, wherein the Ta partition has a thickness of 5 μm or more.

The seventh invention is the precursor wire for $Nb_3Al$ superconducting wire of the above first to fourth inventions, wherein when Ag is used as a constitutional element of cross-section of the assembly, a material in contact with the Ag is Nb or Ta.

The eighth invention is the precursor wire for $Nb_3Al$ superconducting wire of the above seventh invention, wherein the Nb or Ta partition has a thickness of 1 μm or more.

The ninth invention is an $Nb_3Al$ superconducting wire which is obtained from the precursor wire for $Nb_3Al$ superconducting wire of the first to eighth inventions, wherein the Nb/Al composite filament regions have been converted to $Nb_3Al$ filaments.

The tenth invention is a method for producing the precursor wire for $Nb_3Al$ superconducting wire of the above first to eighth inventions, wherein the method comprises: wrapping the metal sheet formed from Nb or Ta, which constitutes the partition, around the Nb/Al composite filament region formed from the composite of Nb and Al mixed in the Nb:Al molar ratio of 3:1; filling the pipe formed from Cu or Ag, which constitutes the interfilamentary barrier layer, with the resultant filament region, subjecting the filled pipe to wire drawing to form the hexagonal single wire, and then cutting the hexagonal single wire into a plurality of wires; obtaining the assembly of the hexagonal single wires and wrapping the metal sheet formed from Nb or Ta, which constitutes the outer cover, around the assembly; filling the Cu pipe or the Cu alloy pipe with the resultant assembly and subjecting the filled pipe to wire drawing to form the fine wire; and removing the Cu or Cu alloy outermost layer by etching from the formed wire.

The eleventh invention is the method for producing the precursor wire for the $Nb_3Al$ superconducting wire of the above tenth invention, wherein the assembly is formed from the hexagonal single wires, and the internal-stabilizer-filament hexagonal wires obtained by subjecting to wire drawing the internal stabilizer filament formed from Cu or Ag and covered with the internal-stabilizer-filament covering-layer formed from Nb or Ta.

The twelfth invention is the method for producing the precursor wire for the $Nb_3Al$ superconducting wire of the above eleventh invention, wherein the internal-stabilizer-filament hexagonal wires constitute the center portion of the assembly and the hexagonal single wires constitute the portion surrounding the center portion.

The thirteenth invention is the method for producing the precursor wire for the $Nb_3Al$ superconducting wire of the above tenth invention, wherein the assembly is formed from the hexagonal single wires, and the dummy-filament hexagonal wires obtained by subjecting to wire drawing the dummy filament formed from Nb or Ta and covered with the dummy-filament-covering-layer formed from Cu or Ag.

The fourteenth invention is the method for producing the precursor wire for the $Nb_3Al$ superconducting wire of the above thirteenth invention, wherein the dummy-filament hexagonal wires constitute the center portion of the assembly and the hexagonal single wires constitute the portion surrounding the center portion.

The fifteenth invention is the method for producing the precursor wire for the $Nb_3Al$ superconducting wire of the above tenth to fourteenth inventions, wherein the volume fraction of Cu or Ag in the hexagonal single wire is 7 to 25%.

The sixteenth invention is the method for producing the precursor wire for the $Nb_3Al$ superconducting wire of the above tenth to fifteenth inventions, wherein when Cu is used as a constitutional element of cross-section of the assembly, Ta is used as the material to be in contact with the Cu.

The seventeenth invention is the method for producing the precursor wire for the Nb₃Al superconducting wire of the above sixteenth invention, wherein the Ta thickness in the hexagonal single wire is 5 µm or more.

The eighteenth invention is the method for producing the precursor wire for the Nb₃Al superconducting wire of the above tenth to fifteenth inventions, wherein when Ag is used as a constitutional element of cross-section of the assembly, Nb or Ta is used as the material to be in contact with the Ag.

The nineteenth invention is the method for producing the precursor wire for the Nb₃Al superconducting wire of the above eighteenth invention, wherein the Nb or Ta thickness in the hexagonal single wire is 1 µm or more.

The twentieth invention is a method for producing an Nb₃Al superconducting wire, which comprises subjecting the precursor wire for the Nb₃Al superconducting wire of the above first to eighth inventions to heat treatment at 1,900° C. or higher within 5 seconds, and then quenching the resultant precursor wire to 500° C. or lower, and subsequently subjecting the quenched wire to additional heat treatment at 700 to 900° C.

Effect of the Invention

By employing in the interfilamentary barrier Cu or Ag which functions also as an internal stabilizer, there can be achieved both the improvement of the wire drawability of the precursor wire and the suppression of the low magnetic-field instability not only at 4 K but also at 2 K after the subsequent RHQT treatment. Further, the development (growth and propagation) of microscopic cracks in the wire due to a load of bending strain can be suppressed.

Furthermore, the present invention allows the production cost reduction, because the precursor wire can be improved in wire drawability, and a stabilizer incorporation step, which has been additionally required after a rapid heating and quenching treatment, can be omitted.

BRIEF DESCRIPTION OF THE DRAWINGS

(FIG. 14(a): Ta partition: 1.6 µm; FIG. 14(b): Ta partition: 5.0 µm).

MODE FOR CARRYING OUT THE INVENTION

Figure 1:
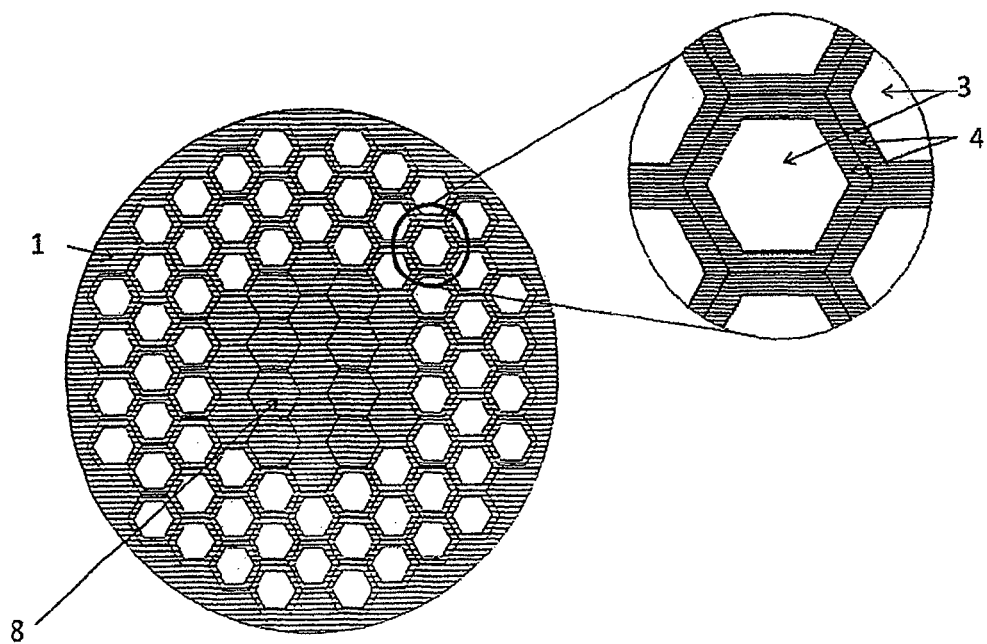
FIG. 1 shows a cross-sectional view of a conventional RHQT-process Nb₃Al precursor wire having an Nb interfilamentary barrier.
Figure 2:
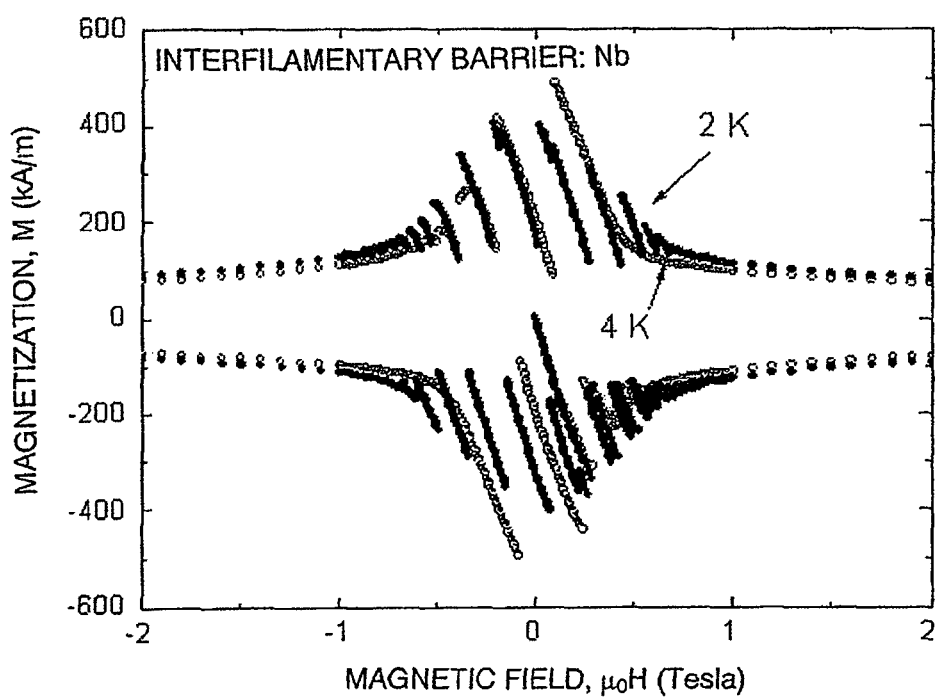
FIG. 2 shows magnetization curves at 4 K and 2 K for an Nb₃Al wire prepared by subjecting to rapid heating and quenching treatment an Nb/Al precursor wire in which an interfilamentary barrier is formed from Nb.
Figure 3:
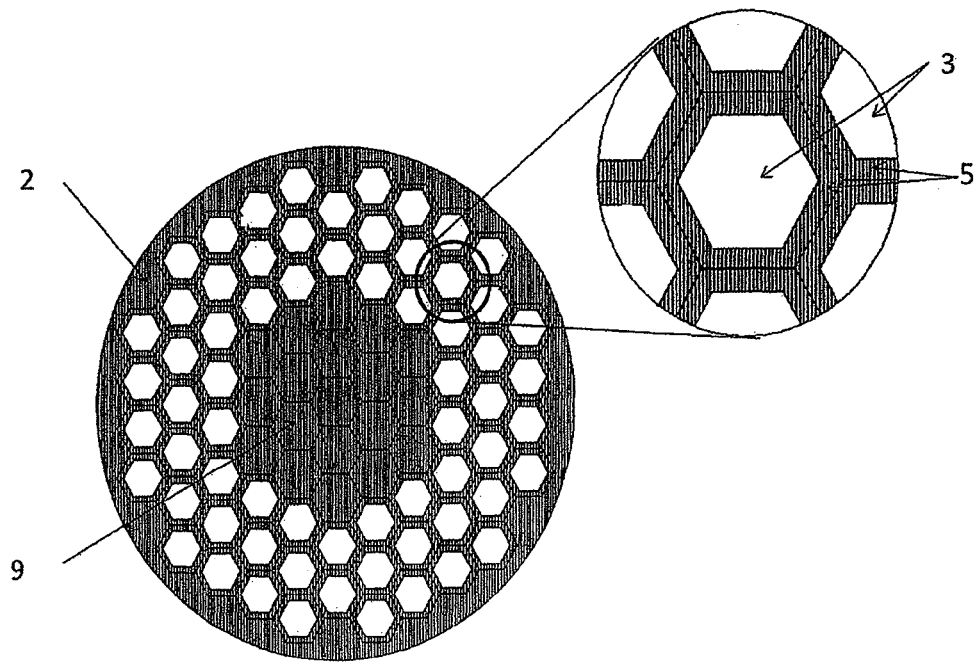
FIG. 3 shows a cross-sectional view of an RHQT-process Nb₃Al precursor wire, in which, in addition to the interfilamentary barrier, an outer cover and dummy filaments are formed from Ta.

The most basic structure of a precursor wire for an $Nb_3Al$ superconducting wire of the invention is an assembly of single wires surrounded with an outer cover (skin), wherein each of the single wires has an Nb/Al composite filament region which is formed from an Nb/Al composite and covered with a partition and an interfilamentary barrier.

A center portion of each single wire constituting the precursor wire for $Nb_3Al$ superconducting wire of the invention is the Nb/Al composite filament region formed from a composite of an Nb metal and an Al metal as main constituents, i.e., a composite of Nb and Al with an Nb:Al molar ratio of 3:1.

Each single wire consists of the Nb/Al composite filament region which is covered with a partition formed from Nb or Ta as a high melting-point metal, and further covered with an interfilamentary barrier formed from Cu or Ag as a normal conductive-metal-&-good-conductor.

The interfilamentary barrier is provided for effectively electromagnetic decoupling of superconducting filaments, and the partition is provided for preventing the interfilamentary barrier from reacting with the Nb/Al composite filament region to form a non-superconducting compound.

By forming an interfilamentary barrier layer, which constitutes the outermost layer of the single wire, from Cu or Ag which is flexible and highly ductile, as compared to Nb or Ta which is the high melting-point metal, excellent wire drawability can be achieved, and the propagation of microscopic cracks in the wire due to a load of bending strain can be suppressed.

The volume fraction of the normal-conductive-metal-&-good-conductor of Cu or Ag constituting the interfilamentary barrier in the single wire is in the range of from 7 to 25%. When the Cu or Ag volume fraction is smaller than 7%, the interfilamentary barrier (Cu or Ag) as the outermost layer of the single wire is likely to become so thin during the wire drawing process that the wire suffers a breakage, making it impossible to perform the wire drawing.

In the invention, the combination of Nb or Ta as a material for the partition and Cu or Ag as a material for the interfilamentary barrier is optional, but, from the viewpoint of preventing the formation of a non-superconducting compound due to a reaction of the interfilamentary barrier with the Nb/Al composite filament region during the rapid-heating, quenching and transformation treatment, it is preferred that when the interfilamentary barrier is formed from Cu, the partition is formed from Ta. This is because when the partition is formed from Nb, the Nb partition dissolves in a melted Cu and thus the Cu would be able to directly react with the Nb/Al composite filament region to form a non-superconducting ternary compound.

In this case, the Ta partition has a thickness of 5 μm or more, preferably in the range of from 5 to 7 μm. When the Ta thickness is 5 μm or more, it is possible to prevent Cu from diffusing through the Ta partition and reacting with the Nb/Al composite filament region to form the non-superconducting ternary compound.

When the interfilamentary barrier is formed from Ag, a material for the partition may be either Nb or Ta. This is because the Nb or Ta partition never dissolves in a melted Ag, and a reaction of Ag with the Nb/Al composite filament region to form a non-superconducting compound need not be taken into consideration. In this case, the Nb or Ta partition has a thickness of 1 μm or more, preferably in the range of from 1 to 3 μm.

A method for producing the single wire is as follows. A high melting-point metal sheet formed from Nb or Ta, which is the material for a partition, is first wrapped around an Nb/Al composite. Then, a pipe formed from Cu or Ag, which constitutes the interfilamentary barrier, is filled with the resultant composite, and subjected to wire drawing to form a hexagonal single wire.

In the conventional production of a precursor wire, at this stage, it is necessary to remove only a Cu outermost layer by etching. In the invention, the Cu outermost layer constitutes the interfilamentary barrier, and therefore a step for removing the Cu outermost layer by etching can be omitted, thus reducing the production cost.

The hexagonal single wire is then cut into a plurality of wires, and a plurality of short-length hexagonal single wires are collected and arranged in closest packing to obtain an assembly, and a high melting-point metal sheet formed from Nb or Ta, which constitutes an outer cover (skin), is wrapped around the assembly, and then a Cu pipe or a Cu alloy pipe is filled with the resultant assembly and further subjected to wire drawing to form a fine wire having a predetermined size. With respect to a method for wire drawing, there is no particular limitation, but dice wire drawing can be preferably employed.

After the wire drawing, finally, the Cu or Cu alloy outermost layer is removed from the resultant wire by etching, obtaining a precursor wire for $Nb_3Al$ superconducting wire of the invention.

The precursor wire for the $Nb_3Al$ superconducting wire of the invention has the above-mentioned basic structure comprising the assembly of the single wires and the outer cover (skin), and can also have the structure wherein the assembly has internal stabilizer filaments disposed inside thereof, preferably in a center portion thereof, and the single wires are disposed to surround the center portion and the outer cover (skin) is disposed around the single wires.

The internal stabilizer filaments in the invention are provided for stabilizing the superconducting state, and each has a structure such that an internal stabilizer filament covering layer formed from Nb or Ta as the high melting-point metal is provided around the normal-conductive-metal-&-good-conductor of Cu or Ag.

When the normal-conductive-metal-&-good-conductor is Cu, the internal stabilizer filament covering layer is preferably formed from Ta. On the other hand, when the normal-conductive-metal-&-good-conductor is Ag, the internal stabilizer filament covering layer may be formed from either Nb or Ta. The reason for this is the same reason for the above-mentioned selection of materials for the interfilamentary barrier and partition in the single wire.

The internal stabilizer filament can be formed into an internal stabilizer filament hexagonal wire by wrapping an Nb or Ta metal sheet around a rod formed from Cu or Ag and inserting the resultant rod into a Cu pipe, and subjecting the pipe containing the rod to dice wire drawing in the same manner as in the production of the single wire, and then removing the Cu outermost layer from the resultant wire by etching.

Further, the precursor wire of the invention can also have the structure wherein the assembly has Cu-(or Ag-)covered dummy filaments disposed inside thereof, preferably in the center portion thereof, and the single wires are disposed to surround the center portion and the outer cover (skin) is disposed around the single wires.

The Cu-(or Ag-)covered dummy filaments are provided for improving the superconducting wire in mechanical strength and improving the drawability of precursor wire, and each has a structure such that a dummy filament covering layer formed from Cu or Ag as the normal-conductive-metal-&-good-conductor is provided around Nb or Ta as the high melting-point metal.

When the dummy filament covering layer is formed from Cu, the high melting-point metal is preferably Ta. On the other hand, when the dummy filament covering layer is formed from Ag, the high melting-point metal may be either Nb or Ta. The reason for this is the same reason for the above-mentioned selection of materials for the interfilamentary barrier and partition in the single wire.

The Cu-(or Ag-)covered dummy filament hexagonal wire can be formed by inserting a rod formed from Nb or Ta into a pipe formed from Cu or Ag, and subjecting the pipe containing the rod to dice wire drawing in the same manner as in the production of the single wire. In this method, a rod is inserted into a pipe formed from the material which finally constitutes the outermost layer, and subjected to wire drawing, and therefore an etching treatment can be omitted.

The precursor wire for the $Nb_3Al$ superconducting wire can be produced from the assembly in which Ta-(or Nb-)covered internal stabilizer filaments are disposed in a center portion and the single wires are disposed to surround the center portion and the assembly in which the Cu-(or Ag-)covered dummy filaments are disposed in the center portion and the single wires are disposed to surround the center portion, by the same method as described in the method for producing the above-mentioned precursor wire for the $Nb_3Al$ superconducting wire comprising the single wires and the outer cover (skin).

Further, in the invention, the $Nb_3Al$ superconducting wire is produced by the rapid-heating, quenching and transformation process from the precursor wire for the $Nb_3Al$ superconducting wire of the invention having the above-described structure.

In the rapid-heating, quenching and transformation process, the precursor wire is subjected to heat treatment at 1,900° C. or higher, preferably 1,930 to 2,000° C., for 5 seconds or less, and then quenched to 500° C. or lower, preferably 30 to 100° C., and subsequently subjected to additional heat treatment at 700 to 900° C.

By subjecting the precursor wire for $Nb_3Al$ superconducting wire of the invention to rapid heating and quenching treatment, the Nb/Al composite filament regions in the precursor wire are converted to bcc phase supersaturated solid solution filaments comprising an Al supersaturated Nb. Further, by subjecting the resultant wire to additional heat treatment, the crystal structure of the filaments is transformed from a bcc phase to an A15 phase, thus obtaining the $Nb_3Al$ superconducting filaments.

As mentioned above, in the conventional $Nb_3Al$ precursor wire produced by the rapid-heating, quenching and transformation process, only an Nb or Ta interfilamentary barrier is present between the Nb/Al composite filament regions adjacent to each other. By contrast, in the invention, as shown in the enlarged views of the single wire of FIGS. 11 to 13, the single wire has a structure such that an Nb/Al composite filament region is covered with a partition formed from Ta or Nb, and further covered with an interfilamentary barrier formed from Cu or Ag disposed around the partition.

Hereinbelow, embodiments of the method for producing a precursor wire in which the normal-conductive-metal-&-good-conductor interfilamentary barrier is formed from Cu will be described in detail, but the present invention is not limited to these embodiments.

First Embodiment (First Step)

Figure 11:
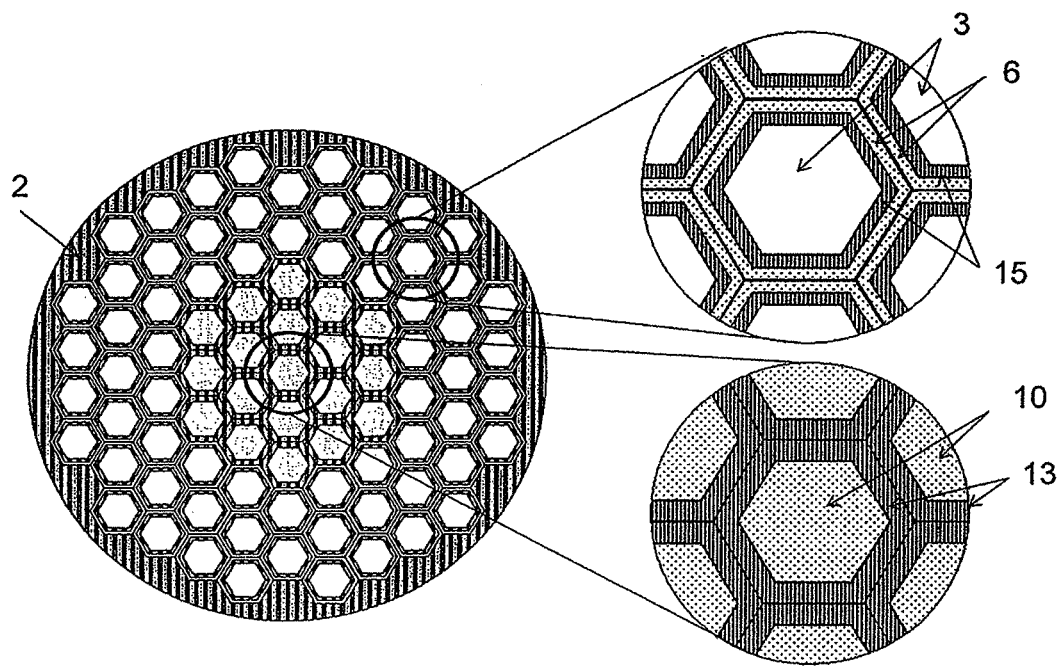
FIG. 11 shows a cross-sectional view of an internal-stabilized RHQT-process Nb₃Al precursor wire, in which the Cu internal stabilizer filaments covered with Ta are disposed instead of the dummy filaments, the interfilamentary barrier is formed from Cu, and both a partition and the outer cover are formed from Ta.

In the first step, a Cu/Ta/(Nb/Al composite) single wire shown in FIG. 11 was formed.

A Ta metal sheet (which corresponds to a Ta partition 15 in the cross-section of the finally obtained precursor wire) was wrapped around an Nb/Al composite prepared by a jelly roll method or a rod-in-tube method (which corresponds to an Nb/Al composite filament region 3 in the cross-section of the finally obtained precursor wire), and the resultant composite was inserted into a Cu pipe (which corresponds to a Cu interfilamentary barrier 6 in the cross-section of the finally obtained precursor wire) and subjected to wire drawing to form a Cu/Ta/(Nb/Al composite) hexagonal single wire.

Figure 12:
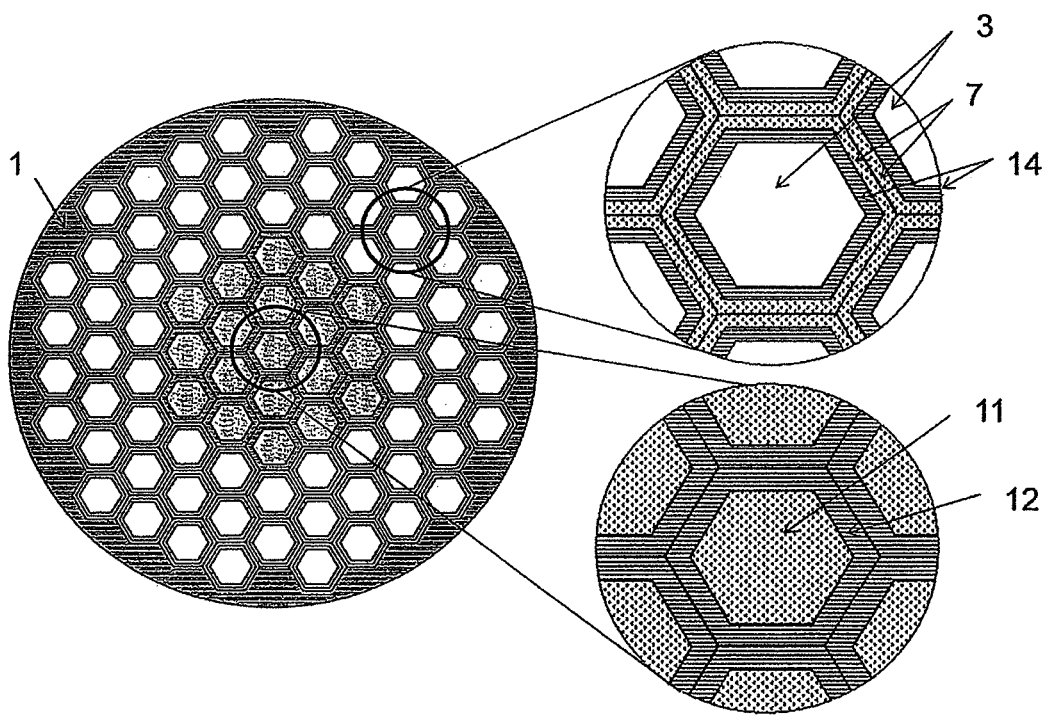
FIG. 12 shows a cross-sectional view of an internal-stabilized RHQT-process Nb₃Al precursor wire, in which the Ag internal stabilizer filaments covered with Nb are disposed instead of the dummy filaments, the interfilamentary barrier is formed from Ag, and both the partition and the outer cover are formed from Nb.
Figure 13:
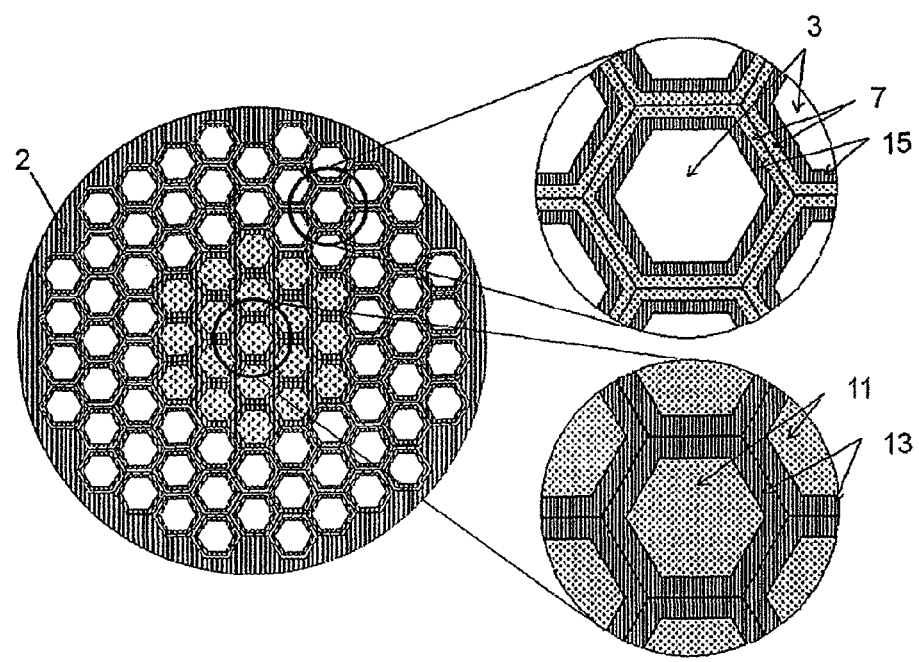
FIG. 13 shows a cross-sectional view of an internal-stabilized RHQT-process Nb₃Al precursor wire, in which the Ag internal stabilizer filaments covered with Ta are disposed instead of the dummy filaments, the interfilamentary barrier is formed from Ag, and both the partition and the outer cover are formed from Ta.

Meanwhile, in the embodiment shown in FIG. 12, a Ag/Nb/(Nb/Al composite) rod of single wire is formed using an Nb sheet (which corresponds to an Nb partition 14 in the cross-section of the finally obtained precursor wire) and a Ag pipe (which corresponds to a Ag interfilamentary barrier 7 in the cross-section of the finally obtained precursor wire), and, in the embodiment shown in FIG. 13, a Ag/Ta/(Nb/Al composite) rod of single wire is formed using a Ta sheet (which corresponds to the Ta partition 15 in the cross-section of the finally obtained precursor wire) and a Ag pipe (which corresponds to the Ag interfilamentary barrier 7 in the cross-section of the finally obtained precursor wire).

(Second Step)

In the second step, as shown in FIG. 11, the internal stabilizer filament hexagonal wires and the hexagonal single wires were assembled to form a precursor wire.

The 66 Cu/Ta/(Nb/Al composite) hexagonal single wires formed in the first step were stacked and disposed around 19 Cu internal stabilizer filament hexagonal wires (which correspond to Cu internal stabilizer filaments 10 in the cross-section of the finally obtained precursor wire) each coated with Ta, which had been separately prepared, and a Ta metal sheet (which corresponds to a Ta outer cover (skin) 2 in the cross-section of the finally obtained precursor wire) was wrapped around the whole of the resultant assembly, and the assembly was inserted into a cupronickel pipe and subjected to hydrostatic extrusion and then, subjected to wire drawing so that a diameter of the resultant wire became 1.5 mmφ without suffering a wire breakage. Finally, a cupronickel outermost layer was removed from the resultant wire by etching to obtain a precursor wire having a diameter of 1.35 mm.

Meanwhile, in the embodiment shown in FIG. 12, a structure was such that Ag/Nb/(Nb/Al composite) hexagonal single wires were disposed around Ag internal stabilizer filament hexagonal wires (which correspond to Ag internal stabilizer filaments 11 in the cross-section of the finally obtained precursor wire) each coated with Nb (which corresponds to an Nb internal stabilizer filament covering layer 12 in the cross-section of the finally obtained precursor wire), and, in the embodiment shown in FIG. 13, a structure was such that Ag/Ta/(Nb/Al composite) hexagonal single wires were disposed around Ag internal stabilizer filament hexagonal wires (which correspond to the Ag internal stabilizer filaments 11 in the cross-section of the finally obtained precursor wire) each coated with Ta (which corresponds to a Ta internal stabilizer filament covering layer 13 in the cross-section of the finally obtained precursor wire).

The number of the Ta-covered Cu internal stabilizer rods in a hexagonal form in the second step is arbitrary. Accordingly, for increasing the volume percentage of the stabilizer in the wire cross-section, the number of the Ta-covered Cu internal stabilizer filament hexagonal wires can be increased, and it is also possible that only the Cu/Ta/(Nb/Al composite) hexagonal single wires prepared in the first step can be collected and arranged in closest packing to form an assembly. This is also the case for the embodiments shown in FIGS. 12 and 13.

The embodiment of the invention shown in FIG. 11 has a feature such that the interfilamentary barriers formed from Cu (or Ag in FIGS. 12 and 13), which is the normal conductive metal and simultaneous good conductor, are directly adjacent to and, hence, connected to each other. As a result, the Ta-(or Nb- in FIG. 12) covered Nb/Al composite filament regions are orderly arranged in the respective Cu (or Ag in FIGS. 12 and 13) regions.

By virtue of the above feature, a Ta/Ta interface between neighboring the Ta interfilamentary barriers which causes the wire drawability of the precursor to be poor, is not present, and, instead, a Ta/Cu/Cu/Ta (or Nb/Ag/Ag/Nb in the embodiment shown in FIG. 12, or Ta/Ag/Ag/Ta in the embodiment shown in FIG. 13) interface is present. Therefore, the remarkable improvement of the wire drawability of the precursor wire has been achieved as one of the effects of the invention. The precursor wire has been actually successfully wire drawn down to the final wire diameter of 1.35 mmφ without breakage.

With respect to two types of the precursor wires (which have been processed by wire drawing without suffering a wire breakage) according to the embodiment having the cross-sectional structure shown in FIG. 11, wherein each of the precursor wires has a diameter of 1.35 mmφ and a Cu-interfilamentary-barrier average-thickness of 6.5 μm, and the respective Ta partitions for separating the normal-conductive-metal-&-good-conductor interfilamentary barrier from the Nb/Al composite filament region in the precursor wires have average thicknesses of 1.6 μm and 5.0 μm, the results of the rapid heating and quenching treatment are described below in detail.

The Cu internal stabilizer filaments 10 were fused at a high temperature, but they were individually coated with Ta, and therefore the cross-sectional structure of the Cu internal stabilizer filaments suffered no marked change after the quenching. On the other hand, as described in detail below in the second embodiment, when the normal-conductive-metal-&-good-conductor interfilamentary barriers 6, which are connected to each other in a wide region, were fused at a high temperature, the Nb/Al composite filament regions 3 surrounded by the Ta partitions 15 shifted from its original position, so that the even thickness of the normal-conductive-metal-&-good-conductor interfilamentary barriers 6 was changed to the thickness having a distribution.

Figure 14:
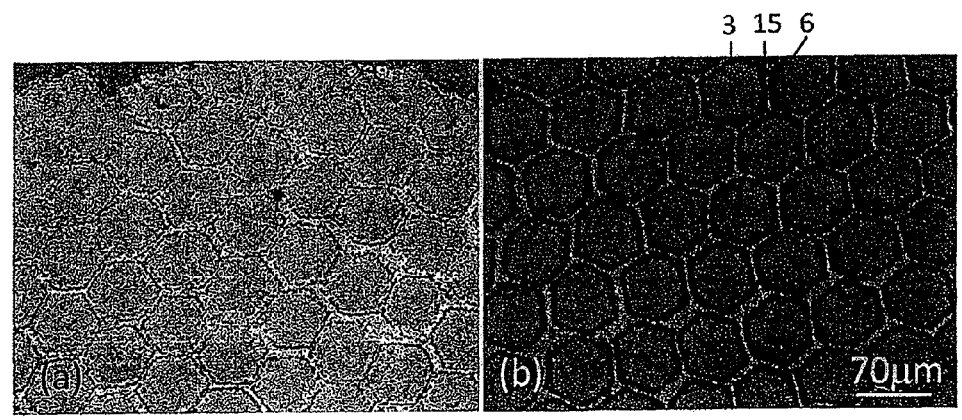
FIGS. 14(a) and 14(b) show enlarged cross-sectional photographs of internal-stabilized Nb₃Al precursor wires that have been subjected to rapid-heating and quenching treatment, in which the interfilamentary barrier is formed from Cu and both the partition and the outer cover are formed from Ta.

When the Ta partitions 15 had an average thickness of 1.6 μm, Cu corroded and penetrated the Ta partitions 15 and was reacted with the Nb/Al composite filament regions 3 to form a non-superconducting ternary (Cu—Nb—Al) compound. A typical example of this case is shown in FIG. 14(a). In the example, the Ta partitions disappear, and Cu diffuses and is reacted with the Nb/Al composite regions.

On the other hand, when the Ta partitions had an average thickness of 5 μm, as shown in FIG. 14(b), the Cu interfilamentary barriers 6 did not penetrate the Ta partitions 15 in almost all the regions, so that bcc phase supersaturated solid solution filaments were properly formed. From the detailed observation, a region was found in which the Ta partition 15 suffered a local breakage, causing the formation of the non-superconducting ternary (Cu—Nb—Al) compound in a slight amount. These results have confirmed that the Ta partitions 15 desirably have an average thickness of at least 5 μm or more when subjected to rapid heating and quenching treatment.

On the other hand, as shown in FIGS. 12 and 13, when the interfilamentary barrier and the internal stabilizer filaments are formed from Ag, the partition for separating the interfilamentary barrier from the Nb/Al composite filament region and the internal stabilizer filament covering layer may be individually formed from either Nb or Ta in principle.

The improvement of the wire drawability of the precursor wire and the suppression of the low magnetic-field instability at both temperatures of 4 K and 2 K, which are the effects of the invention, can be achieved when the partition is formed from Ta. However, each of elements Ag and Ta increases the cost for raw materials, and therefore, when the interfilamentary barrier is formed from Ag, it is recommended that the partition and the internal-stabilizer-filament-covering-layer are individually formed from Nb.

The effects of the invention shown in FIG. 12, in which the partition 14 and the internal-stabilizer-filament-covering-layer 12 are individually formed from Nb, are described below in more detail.

As mentioned above, Ta dissolves into fused Cu, though in a very small amount, at a temperature as high as about 1,950° C., and Cu is likely to conversely pass through the Ta partitions, which are locally reduced in thickness due to the corrosion (dissolving of Ta into Cu), and then be reacted with the Nb/Al composite filament regions. In contrast, Nb almost never dissolves into fused Ag, and the non-reactivity between Nb and Ag is more perfect than that between Ta and Cu.

Therefore, the average thickness of the Nb partitions can be reduced to 1 μm, which is a fifth of the average thickness of the Ta partitions when the interfilamentary barrier is formed from Cu. Consequently, with respect to the non-stabilizer critical current density obtained by dividing a critical current by the sectional area excluding the stabilizer, a value in the case where the normal-conductive-metal-&-good-conductor interfilamentary barrier and the internal stabilizer filaments are individually formed from Ag can be higher than a value in the case where they are individually formed from Cu.

In the first embodiment having the structure shown in FIG. 11, the 19 Ta-(or Nb- in FIG. 12, or Ta- in FIG. 13)covered Cu (or Ag in FIGS. 12 and 13) internal stabilizer filaments 10 in a hexagonal form are concentrated and disposed in the middle of the wire cross-section. When the internal stabilizer filaments 10 are formed from Cu, Ta constituting the internal-stabilizer-filament-covering-layers 13 is directly in contact with the adjacent Ta internalstabilizer-filament-covering-layers 13, so that Ta/Ta interfaces remain in the whole cross-section of the wire. From the viewpoint of improving the wire drawability, it is desired that the Ta/Ta interfaces are removed also from the middle portion of the wire cross-section.

Figure 15:
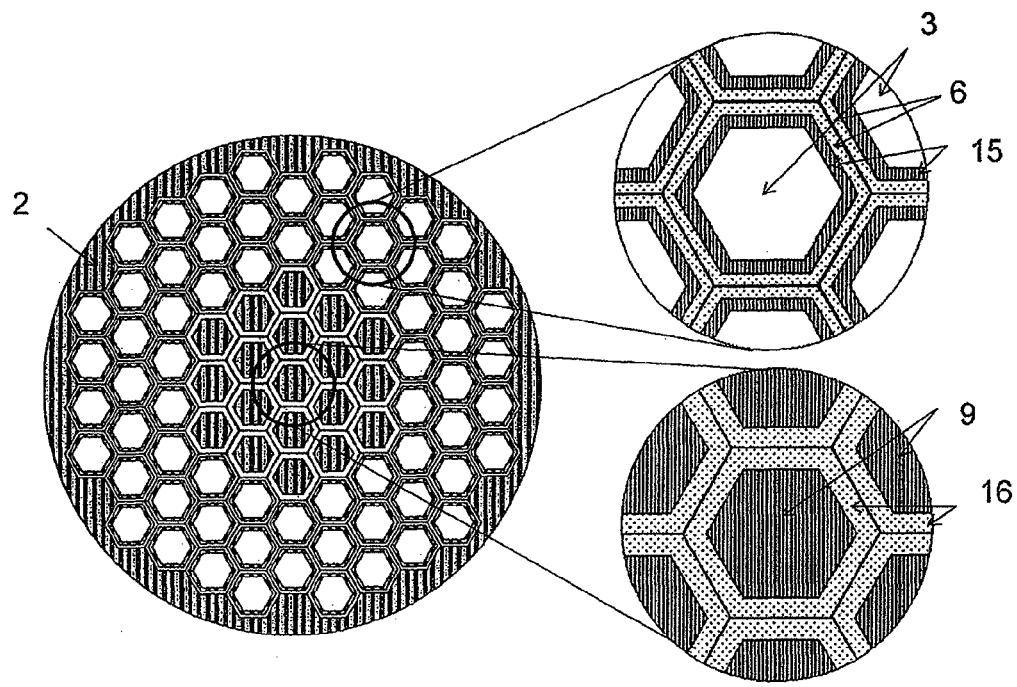
FIG. 15 shows a cross-sectional view of a RHQT-process Nb₃Al precursor wire, in which the Cu-covered Ta dummy filaments are disposed in the middle of a cross-section, the interfilamentary barrier is formed from Cu, and both the partition and the outer cover are formed from Ta.
Figure 16:
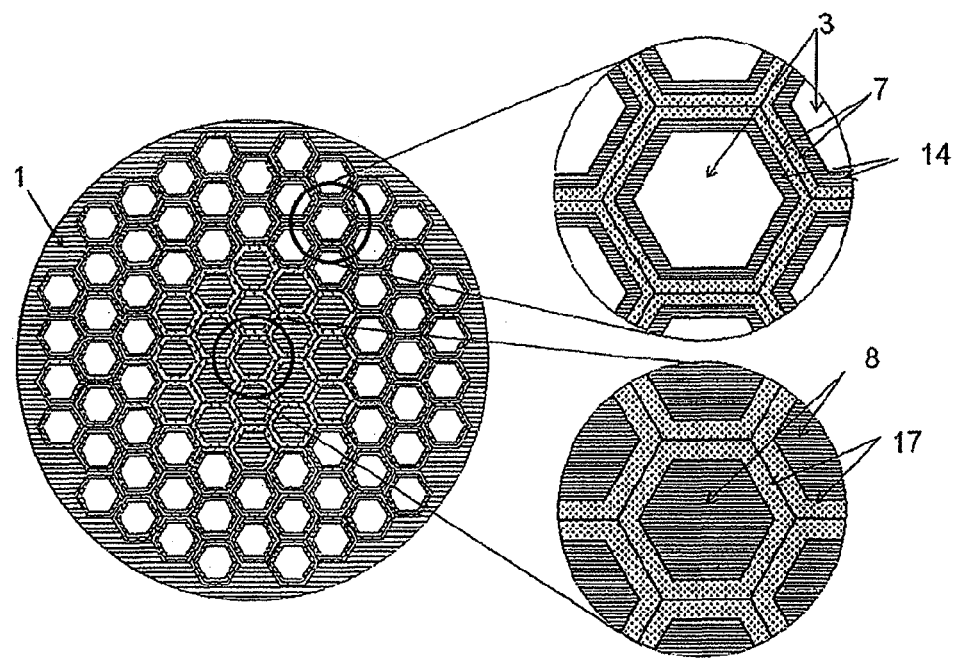
FIG. 16 shows a cross-sectional view of an RHQT-process Nb₃Al precursor wire, in which Ag-covered Nb dummy filaments are disposed in the middle of the cross-section, the interfilamentary barrier is formed from Ag, and both the partition and the outer cover are formed from Nb.
Figure 17:
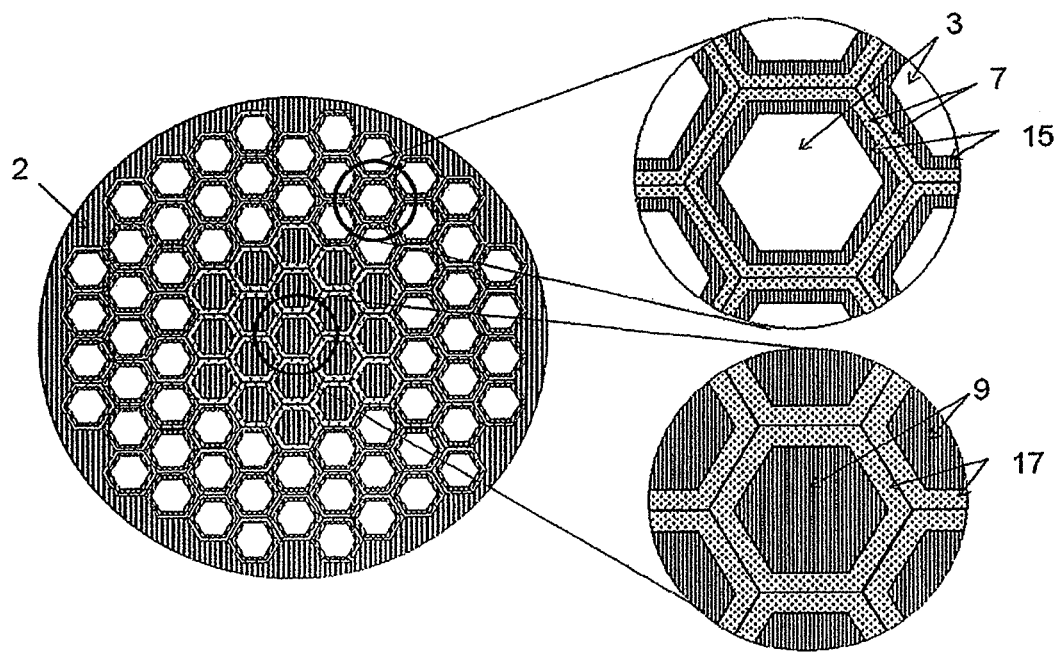
FIG. 17 shows a cross-sectional view of an internal-stabilized RHQT-process Nb₃Al precursor wire, in which Ag-covered Ta dummy filaments are disposed in the middle of the cross-section, the interfilamentary barrier is formed from Ag, and both the partition and the outer cover are formed from Ta.

For achieving this, a precursor wire was prepared in which, as shown in FIGS. 15 to 17, Ta (or Nb, Ta) dummy filaments each covered with Cu (or Ag), which is the same material as the material for the normal-conductive-metal-&-good-conductor interfilamentary barrier, are disposed in the middle portion of the wire cross-section. As a result, the precursor wire was able to be drawn without suffering a wire breakage.

A second embodiment of the method for producing a precursor wire, in which the normal-conductive-metal-&-good-conductor interfilamentary barrier is formed from Cu, is described below in detail with reference to FIG. 15.

Second Embodiment (First Step)

In the first step, a Cu/Ta/(Nb/Al composite) hexagonal single wire was formed.

In the same manner as in the first embodiment, a Ta metal sheet was wrapped around an Nb/Al composite prepared by a jelly roll method or a rod-in-tube method, and the resultant composite was inserted into a Cu pipe and subjected to wire drawing to form a Cu/Ta/(Nb/Al composite) hexagonal single wire.

(Second Step)

In the second step, a Ta dummy filament 9 covered with a Cu dummy-filament-covering-layer 16 was formed by inserting a cylindrical Ta rod into a Cu pipe and subjecting the pipe containing the rod to wire drawing, and subjecting the resultant rod to wire drawing using a hexagonal dice having the same size as that of the dice used in the above-mentioned formation of Cu/Ta/(Nb/Al composite) hexagonal single wire.

As mentioned above in connection with the first embodiment, the Cu outermost layer is finally utilized as an interfilamentary barrier 6, and therefore a step for removing Cu by etching can be omitted at this stage, making it possible to reduce the production cost for the precursor wire.

No need for the removal of the Cu outermost layer not only omits the etching step but also gives the following advantage. Specifically, the size of the finished wire directly depends on the hexagonal dice, and therefore the Cu/Ta/(Nb/Al composite) hexagonal single wire and the hexagonal-form. Ta dummy filament coated with hexagonal-form Cu dummy-filament-covering-layer in the invention are remarkably improved in the size precision, as compared to the conventional Nb/Al composite hexagonal single wire coated with hexagonal-form Ta and hexagonal-form Ta-covered Cu internal stabilizer filament hexagonal wire, which are obtained by etching the Cu outermost layer.

Accordingly, in forming the assembly in the second step, when the 66 Cu/Ta/(Nb/Al composite) hexagonal single wires are stacked and disposed around the 19 Cu-covered Ta dummy filament hexagonal wires in a hexagonal form, a packing ratio of about 100% is achieved.

When a Ta sheet is wrapped around the assembly and the resultant assembly is inserted into a cupronickel pipe and subjected to hydrostatic extrusion, the individual hexagonal rods can be reduced in diameter without suffering deformation of their hexagonal forms. The prevention of irregular deformation of the hexagonal rods ensures excellent wire drawing in the subsequent dice wire drawing, enabling wire drawing without a wire breakage so that the diameter of the resultant wire becomes, for example, 1.5 mmφ.

In an actual process, after the wire drawing, the cupronickel outermost layer of the resultant wire was removed by etching to obtain a precursor wire having a diameter of 1.35 mm. In this case, the Cu interfilamentary barriers had an average thickness of 6.5 μm, and the Ta partitions between the Cu low melting-point normal conductive interfilamentary barrier and the Nb/Al composite filament region had an average thickness of 5.0 μm.

Figure 18:
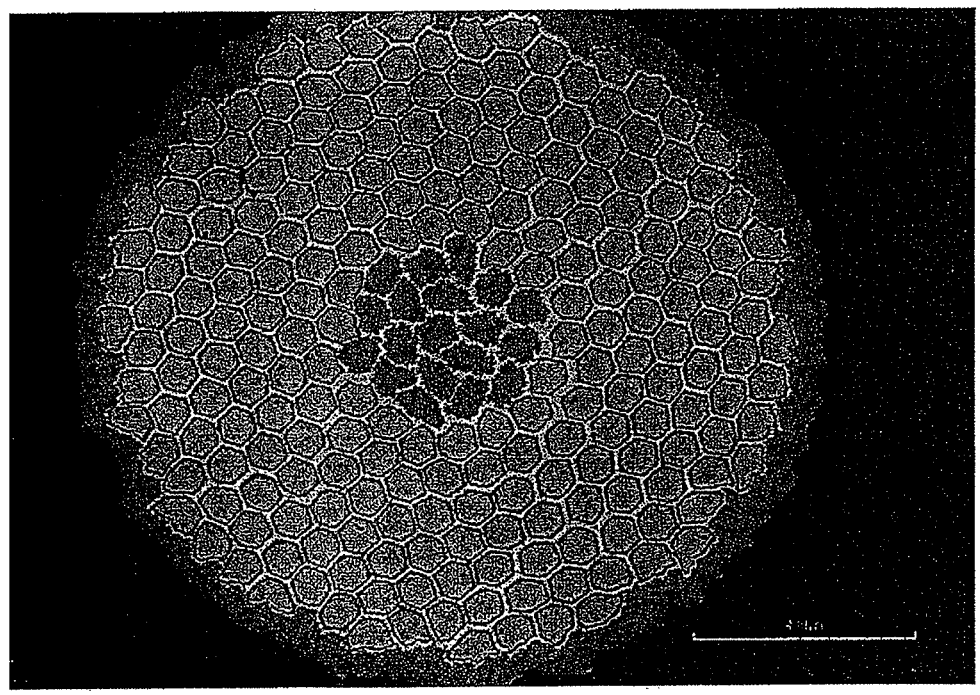
FIG. 18 shows a photograph of the whole of transverse cross-section of a precursor wire (φ 1.35 mm) in which a normal-conductive-metal-&-good-conductor interfilamentary barrier is formed from Cu and the Cu-covered Ta dummy filaments are disposed in the middle of the cross-section, which has been subjected to rapid heating and quenching treatment.

The precursor wire (φ1.35 mm) in which the normal-conductive-metal-&-good-conductor interfilamentary barrier is formed from Cu was subjected to rapid heating and quenching treatment. As shown in the photograph of the cross-section of the quenched wire of FIG. 18, when the Cu interfilamentary barriers, which are connected to each other in a wide region, were fused at a high temperature, the center coordinates on the "Nb/Al composite filament regions covered with the Ta partitions" (which had been converted to bcc phase supersaturated solid solution filaments) moved, so that the even thickness of the Cu interfilamentary barriers was changed to the thickness having a distribution.

When the shift of the center coordinates on the "Nb/Al composite filament regions covered with the Ta partitions" after the rapid heating and quenching treatment exceeds half of the size of the "Nb/Al composite filament region covered with the Ta partition", there is a possibility that the "Nb/Al composite filament regions covered with the Ta partitions" adjacent to each other as viewed in the longitudinal direction of the wire are subjected to crossing one another. When such crossing of the regions occurs, a breakage of the "Nb/Al composite filament regions covered with the Ta partitions" may occur at the crossing point during a plastic deformation after quenching (wire drawing), which is conducted for the purpose of improving the critical current density after the transformation.

For avoiding such a breakage, the volume fraction (cross-sectional area fraction) of the Cu interfilamentary barriers in the single wire including the "Nb/Al composite filament regions covered with the Ta partitions" is desirably 25% or less. The Ta partition is required to have a thickness of at least 5 μm or more.

In the precursor wire in the second embodiment in which the Ta partition has a thickness of 5.0 μm, it was possible to satisfactorily prevent Cu from diffusing into and reacting with the Nb/Al composite filament regions, thus inhibiting the formation of a ternary Cu—Nb—Al compound.

After the quenching, the Nb/Al composite filament regions had been converted to the bcc phase supersaturated solid solution, and the plastic deformation after quenching, which is conducted for the purpose of improving the critical current density, was able to be achieved by cold wire drawing so that the quenched wire became from 1.35 mmφ to 0.5 mmφ without causing the wire to suffer a wire breakage.

The rapid heating and quenching-treated wire was subjected to additional heat treatment (transformation heat treatment) at 800° C. for 10 hours to convert (transform) bcc phase supersaturated solid solution filaments to A15 $Nb_3Al$ filaments.

Figure 4:
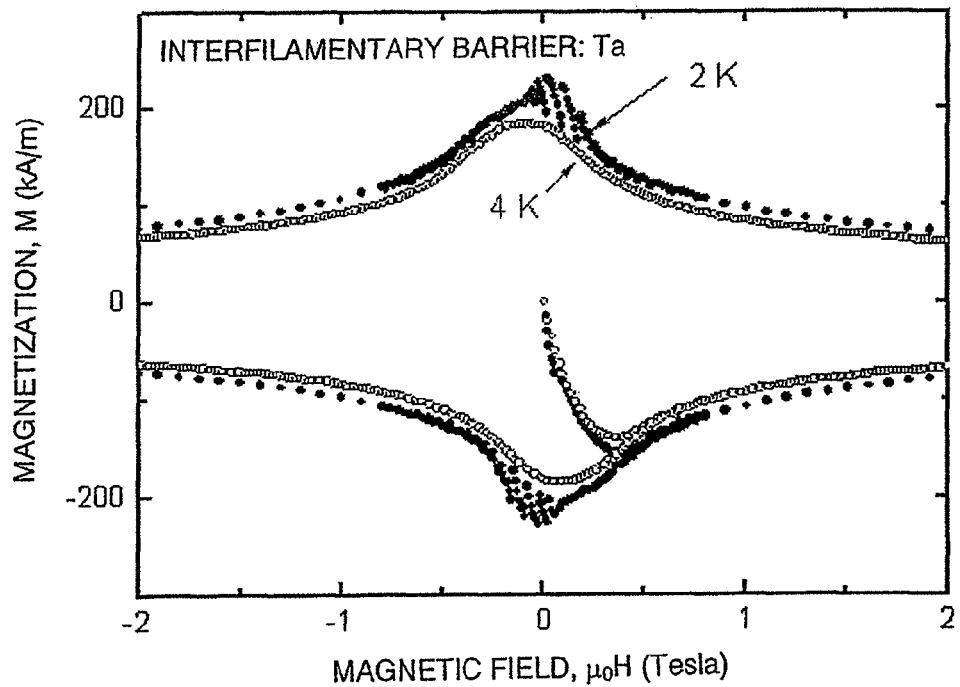
FIG. 4 shows magnetization curves at 4 K and 2 K for an Nb₃Al wire prepared by subjecting to rapid heating and quenching treatment an Nb/Al precursor wire in which, in addition to the interfilamentary barrier, the outer cover and dummy filaments are formed from Ta.
Figure 5:
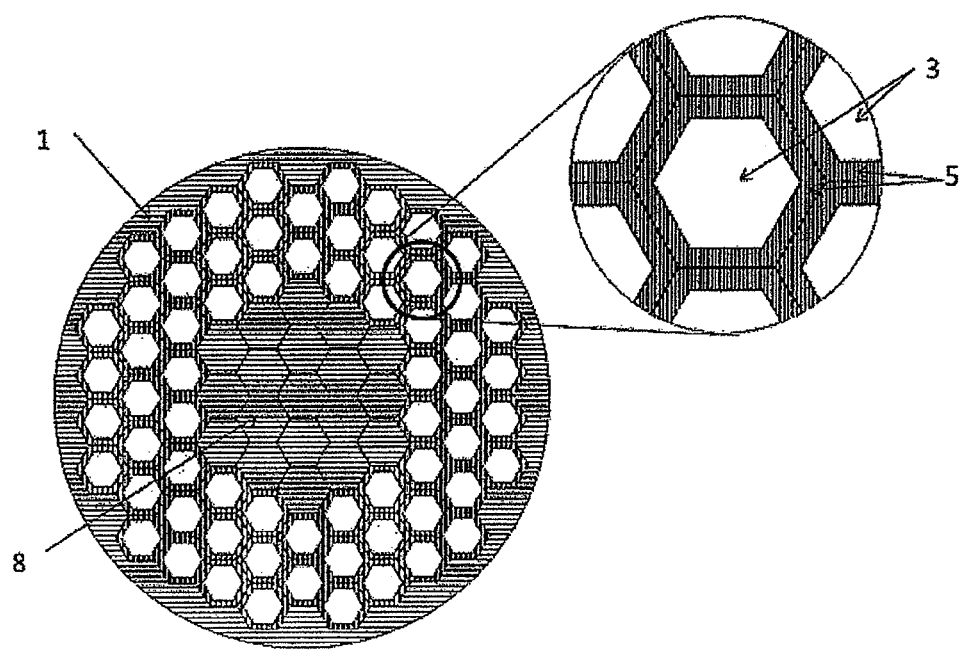
FIG. 5 shows a cross-sectional view of a RHQT-process Nb₃Al precursor wire, in which the outer cover and dummy filaments are formed from Nb and only the interfilamentary barrier is formed from Ta.
Figure 6:
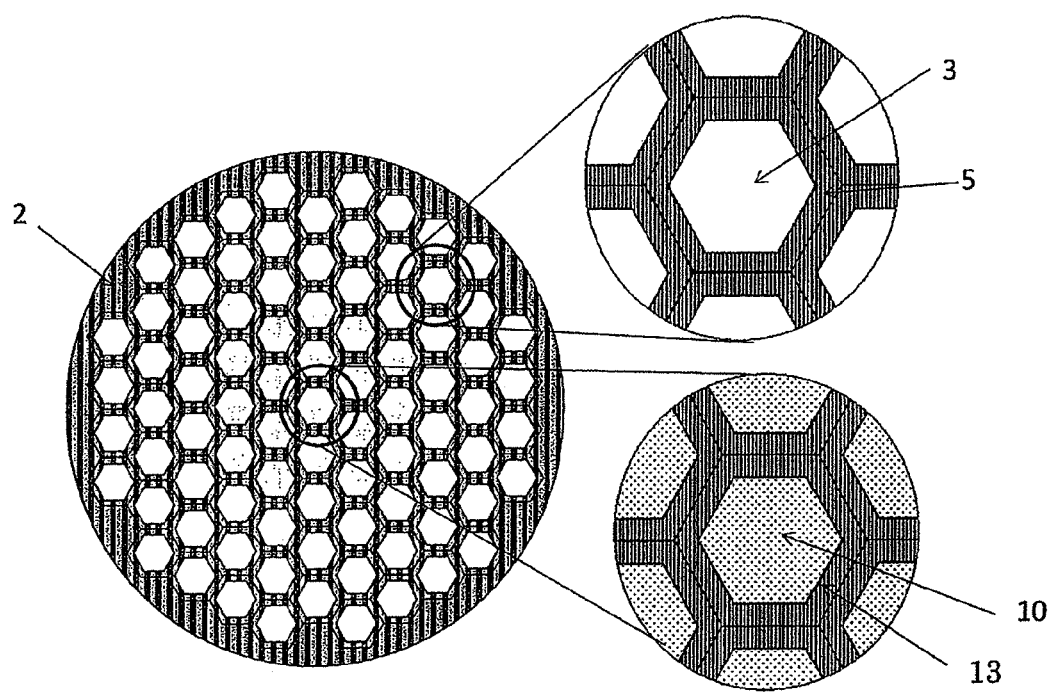
FIG. 6 shows a cross-sectional view of an internal-stabilized RHQT-process Nb₃Al precursor wire, in which Cu internal stabilizer filaments covered with Ta are disposed instead of the dummy filaments, and both the interfilamentary barrier and the outer cover are formed from Ta.
Figure 7:
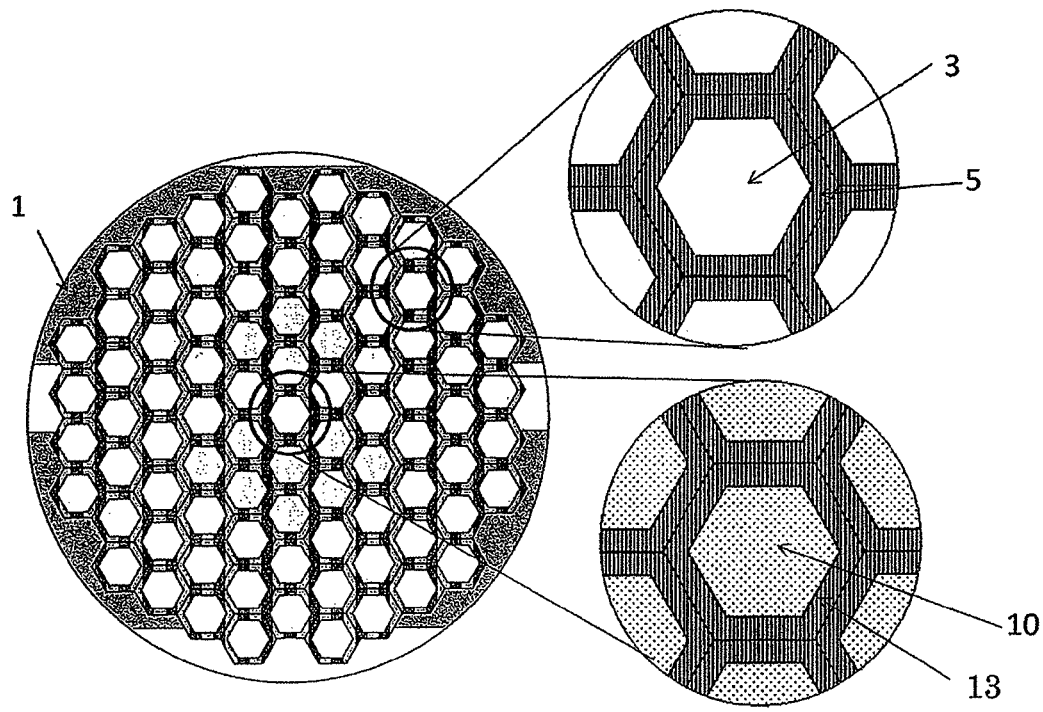
FIG. 7 shows a cross-sectional view of an internal-stabilized RHQT-process Nb₃Al precursor wire, in which the Cu internal stabilizer filaments covered with Ta are disposed instead of the dummy filaments, the interfilamentary barrier is formed from Ta, and the outer cover is formed from Nb.
Figure 8:
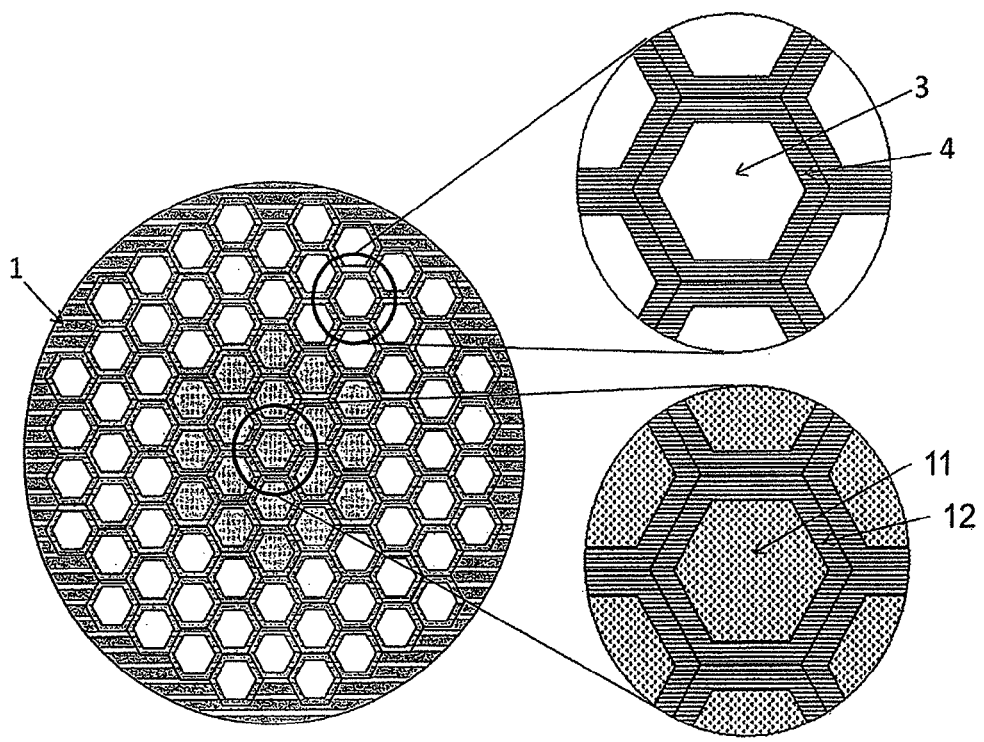
FIG. 8 shows across-sectional view of an internal-stabilized RHQT-process Nb₃Al precursor wire, in which Ag internal stabilizer filaments covered with Nb are disposed instead of the dummy filaments, and both the interfilamentary barrier and the outer cover are formed from Nb.
Figure 9:
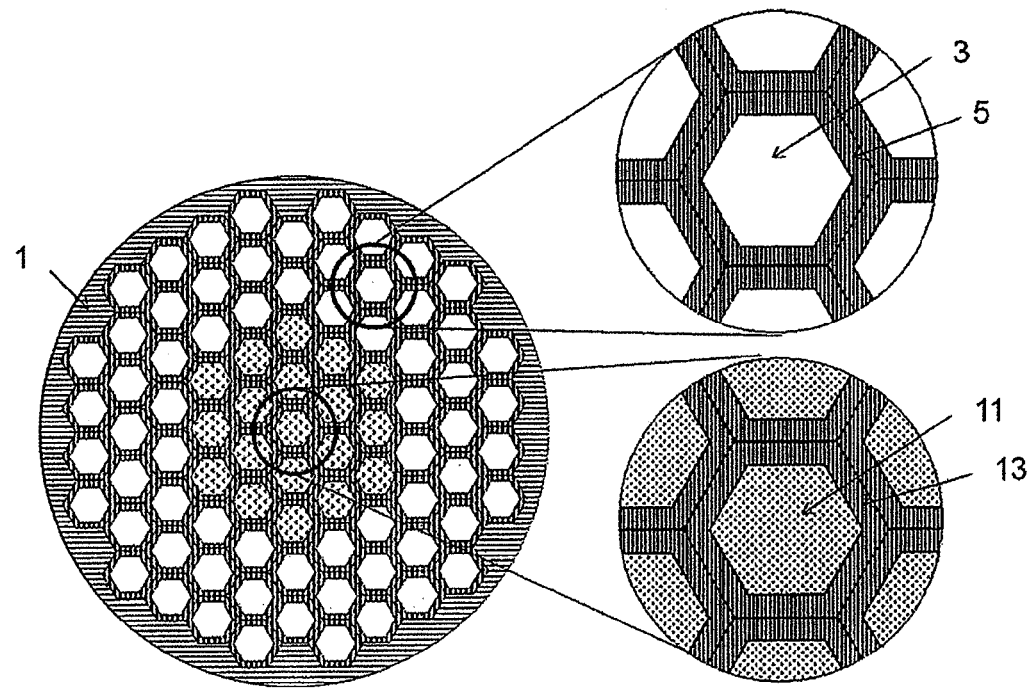
FIG. 9 shows a cross-sectional view of an internal-stabilized RHQT-process Nb₃Al precursor wire, in which the Ag internal stabilizer filaments covered with Ta are disposed instead of the dummy filaments, the interfilamentary barrier is formed from Ta, and the outer cover is formed from Nb.
Figure 10:
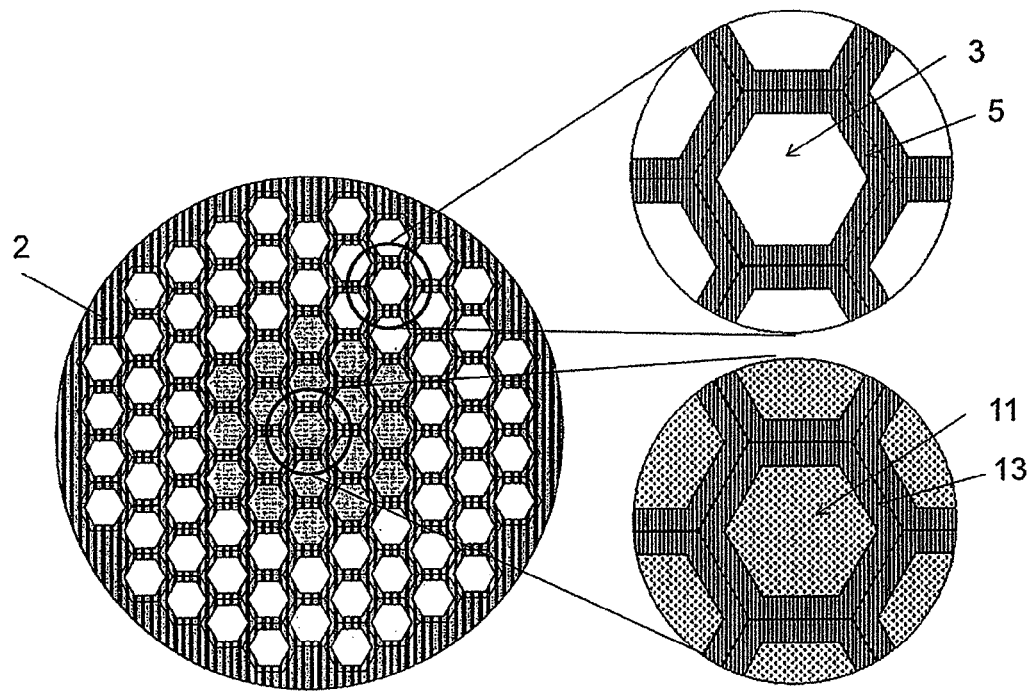
FIG. 10 shows a cross-sectional view of an internal-stabilized RHQT process Nb₃Al precursor wire, in which the Ag internal stabilizer filaments covered with Ta are disposed instead of the dummy filaments, and both the interfilamentary barrier and the outer cover are formed from Ta.
Figure 19:
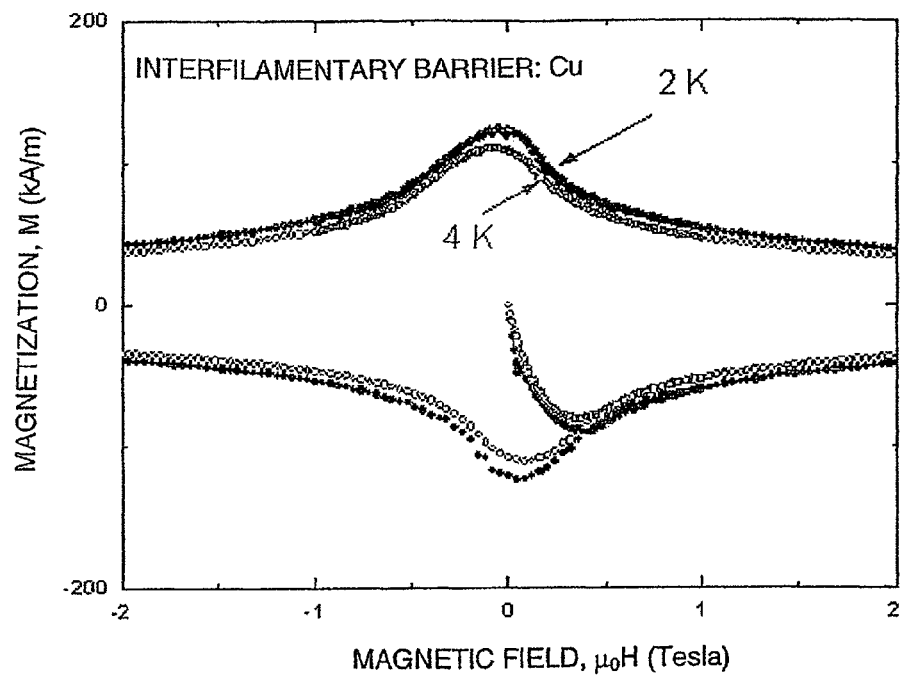
FIG. 19 shows magnetization curves of an $Nb_3Al$ wire produced by rapid-heating, quenching and transformation process, in which the normal-conductive-metal-&-good-conductor interfilamentary barrier is formed from Cu and the Cu-covered Ta dummy filaments are disposed in the middle of the cross-section.

FIG. 19 shows magnetization curves of an A15 $Nb_3Al$ wire as measured at respective temperatures of 4 K and 2 K. In contrast to a conventional $Nb_3Al$ wire in which the interfilamentary barrier is formed from Ta (FIG. 4), the $Nb_3Al$ wire of the invention, in which the interfilamentary barrier is formed from Cu, suppresses the occurrence of a flux jump (low magnetic-field instability) not only at 4 K but also at 2 K. From this result, it has been found that the adoption of Cu, which is the normal conductive metal and good conductor, as the interfilamentary barrier can electromagnetically decouple the $Nb_3Al$ filaments effectively even at 2 K.

A difference between the first embodiment and the second embodiment resides in that the Ta-(or Nb-)covered internal stabilizer filaments or the Cu-(or Ag-) covered dummy filaments are disposed in the middle portion of the wire cross-section. When the first and second embodiments are compared in respect of the incorporation of the stabilizer, the first embodiment has an advantage in that an area fraction of Cu or Ag expected to function as the stabilizer in the total wire sectional area can be larger than that in the second embodiment.

Third Embodiment

Various effects of the invention are achieved by adopting as the interfilamentary barrier Cu or Ag which is extremely soft and highly ductile, as compared to Nb or Ta which is a high melting-point metal. In the first and second embodiments, it is described that the precursor wire can be remarkably improved in wire drawability by having no Ta/Ta interface which has conventionally caused the precursor wire to have poor wire drawability, and adopting as the interfilamentary barrier Cu or Ag which is extremely flexible and highly ductile, as compared to Ta.

On the other hand, the effect of the invention achieved due to the softness and ductility of the material for the interfilamentary barrier reflects not only on the wire drawability of the precursor wire but also on the tolerance to bending of the $Nb_3Al$ wire which has been subjected to the rapid heating, quenching, and transformation annealing. The properties of tolerance to bending strain are described in detail below.

A precursor wire ($\phi$ 1.35 mm), in which the interfilamentary barrier is formed from Cu and the Cu-covered Ta dummy filaments are disposed in the middle of the cross-section, was subjected to rapid heating and quenching treatment, and then formed into a flat wire having a thickness of 0.35 mm by processing using a flat roller, which processing also serves as plastic deformation for improving the critical current density. Then, a thin Cu layer was deposited by electroplating on a surface of the resultant wire so as to enable soldering, and the wire was subjected to transformation heat treatment at 800° C. as it was straight to obtain a straight $Nb_3Al$ flat-wire used for evaluation of the tolerance to bending.

Figure 20:
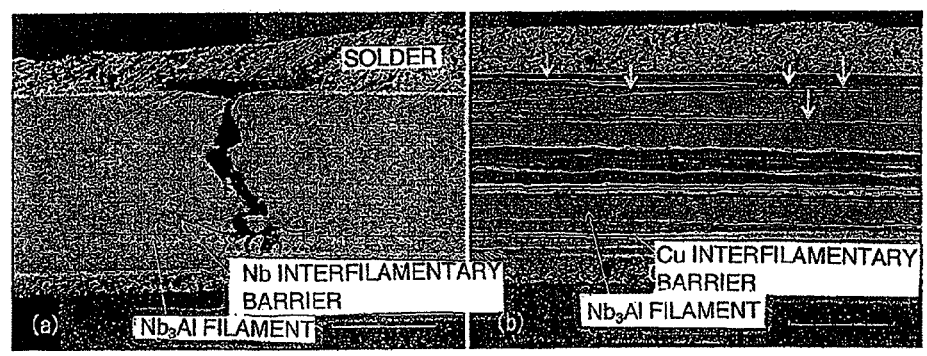
FIG. 20 show longitudinal cross-sectional photographs of $Nb_3Al$ wires that have been RHQT treated and subsequently bent and relaxed. (a): the interfilamentary barrier is formed from Nb and a bending strain was applied up to 0.4%, (b): an interfilamentary barrier wire is formed from Cu and a bending strain was applied up to 0.46%.

Some types of humpback bridge that consists of brass substrates with a curvature equal to the bending strain which would be applied to the wire were prepared, and the above-obtained straight $Nb_3Al$ flat-wire was subjected to bending deformation by pressing the wire against the substrate, and the resultant wire was fixed in this state by soldering, and a critical current density was measured. FIG. 20(a) shows a longitudinal cross-section of a conventional $Nb_3Al$ flat-wire produced by the rapid-heating, quenching and transformation process in which the interfilamentary barrier is formed from Nb, which is obtained by removing the bending strain after subjected to bending strain test at a bending strain of up to 0.4%.

On the surface of the flat wire, a thin Cu electroplating layer and a solder outside the Cu layer are observed. When a bending strain of up to 0.35% was applied to the wire, the critical current density was constant and almost the same as that of the straight wire, but when a bending strain of 0.4% was applied to the wire, the critical current density was rapidly reduced to zero and a crack penetrated the whole cross-section.

On the other hand, as shown in FIG. 20(b), with respect to the wire in which the interfilamentary barrier is formed from Cu which is soft and highly ductile, when a bending strain of up to 0.4%, which is larger by 0.05(%) than the above upper limit bending strain of the wire having the Nb interfilamentary barrier, was applied to the wire, the critical current density was kept constant as in the case where the bending strain was zero. When a bending strain of up to 0.46% is further applied to the wire, the critical current density is slightly reduced to about 70 percent, but cracks (indicated by white arrows) caused in the $Nb_3Al$ filaments near the surface of the wire to which a tensile strain is applied have not completely penetrated the cross-section of the wire but stopped in the Cu interfilamentary barrier portions. It can be understood that the soft Cu relaxes the stress concentration on ends of cracks to exhibit an effect of suppressing the development of cracks in the wire.

INDUSTRIAL APPLICABILITY

The improvement of tolerance to bending strain of the $Nb_3Al$ superconducting wire, by the effect of the invention, allows a coil fabrication method in which a precursor wire is converted (reacted) to an A15 compound and then wound into a coil (a so-called react and wind method). When the react and wind method can be employed, there is no need to prepare a large-size furnace for heat treatment according to the shape of the coil.

In contrast, when the react and wind method cannot be employed, there is inevitably employed a method in which a highly ductile precursor wire with a high-temperature heat-treatment tolerant ceramic-insulation is wound into a coil and then converted (reacted) to an A15 compound (wind and react method). Since the ceramic insulation requires a thicker coating than the varnish or polyimide based insulating material for the react and wind method does, the insulating material ratio in the coil has to be increased in comparison with the react and wind coil. As a result, high critical current density characteristic in a magnetic field, which is a merit of the A15 compound, cannot be utilized, and further the coil must be increased in size and weight due to a reduction of its energy density.

As mentioned above, in the invention, the react and wind method can be employed so that, instead of ceramic insulating materials, varnish insulating and polyimide based insulating materials having a small volume ratio can be utilized to achieve a compact and lightweight coil having an increased coil current density.

DESCRIPTION OF REFERENCE NUMERALS

1: Outer cover (skin): Nb
2: Outer cover (skin): Ta
3: Nb/Al Composite filament region
4: Interfilamentary barrier: Nb
5: Interfilamentary barrier: Ta
6: Interfilamentary barrier: Cu
7: Interfilamentary barrier: Ag
8: Dummy filament: Nb
9: Dummy filament: Ta
10: Internal stabilizer filament: Cu
11: Internal stabilizer filament: Ag
12: Internal stabilizer filament covering layer: Nb
13: Internal stabilizer filament covering layer: Ta 14: Partition: Nb
15: Partition: Ta
16: Dummy filament covering layer: Cu
17: Dummy filament covering layer: Ag

The invention claimed is:

1. A precursor wire for producing an $Nb_3Al$ superconducting wire by rapid-heating, quenching and transformation processes, comprising an assembly of a plurality of single wires, the assembly being covered with an outer cover (skin) formed from Nb or Ta,
  wherein each of the single wires comprises an Nb/Al composite filament region which is formed from a composite of Nb and Al mixed in an Nb:Al molar ratio of 3:1, an interfilamentary barrier formed from Cu or Ag covered on the outside of the Nb/Al composite filament region for effectively electromagnetic decoupling of superconducting filaments, and a partition formed from Nb or Ta provided between the Nb/Al composite filament region and the interfilamentary barrier for preventing the interfilamentary barrier from reacting with the Nb/Al composite filament region to form a non-superconducting compound,
  wherein the volume fraction of Cu or Ag in the single wire is 7 to 25%, and
  wherein, when Cu is used as the interfilamentary barrier, Ta film having a thickness of 5 μm or more is used as the partition, and, when Ag is used as the interfilamentary barrier, Nb or Ta film having a thickness of 1 μm or more is used as the partition.

2. The precursor wire for producing $Nb_3Al$ superconducting wire according to claim 1, wherein internal stabilizer filaments each formed from Cu or Ag and covered with an internal-stabilizer-filament-covering-layer formed from Nb or Ta are disposed inside the assembly.

3. The precursor wire for producing $Nb_3Al$ superconducting wire according to claim 1, wherein dummy filaments each formed from Nb or Ta and covered with a dummy filament covering layer formed from Cu or Ag are disposed inside the assembly.

4. The precursor wire for producing $Nb_3Al$ superconducting wire according to claim 1, wherein the assembly comprises Cu, and wherein the assembly is covered with the outer cover (skin) comprising Ta.

5. The precursor wire for producing $Nb_3Al$ superconducting wire according to claim 1, wherein the assembly comprises Ag, and wherein the assembly is covered with the outer cover (skin) comprising Nb or Ta.

6. An $Nb_3Al$ superconducting wire which is obtained from the precursor wire for the $Nb_3Al$ superconducting wire according to claim 1, wherein the Nb/Al composite filament regions have been converted to the $Nb_3Al$ filaments.

7. A method for producing an $Nb_3Al$ superconducting wire, comprising: subjecting the precursor wire for the $Nb_3Al$ superconducting wire according to claim 1 to heat treatment at 1,900° C. or higher for 5 seconds or less; quenching the resultant precursor wire to 500° C. or lower; and subjecting the quenched wire to additional heat treatment at 700 to 900° C.

* * * * *